(12) United States Patent
Zhang et al.

(10) Patent No.: US 7,784,973 B2
(45) Date of Patent: Aug. 31, 2010

(54) LED LAMP

(75) Inventors: Wen-Xiang Zhang, Shenzhen (CN); Guang Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 109 days.

(21) Appl. No.: 12/252,375

(22) Filed: Oct. 16, 2008

(65) Prior Publication Data

US 2009/0296403 A1    Dec. 3, 2009

(30) Foreign Application Priority Data

May 28, 2008   (CN) .................... 2008 1 0067517

(51) Int. Cl.
*F21V 29/00* (2006.01)

(52) U.S. Cl. .................. 362/294; 362/373; 362/311.02; 362/311.14

(58) Field of Classification Search ................. 362/267, 362/294, 311.02, 311.06, 311.13, 311.14, 362/373, 640, 641, 643, 644, 645, 646
See application file for complete search history.

(56) References Cited

U.S. PATENT DOCUMENTS

| 7,628,513 | B2 * | 12/2009 | Chiu ..................... 362/311.02 |
| 2008/0151548 | A1 * | 6/2008 | Desfosses .................. 362/322 |
| 2009/0034261 | A1 * | 2/2009 | Grove ........................ 362/294 |

* cited by examiner

*Primary Examiner*—Y My Quach Lee
(74) *Attorney, Agent, or Firm*—Frank R. Niranjan

(57) ABSTRACT

An LED wall lamp includes a heat sink having a base, an LED module attached to a top surface of the base of the heat sink, an envelope attached to the top surface of the base and receiving the LED module therein, and a cover coupled to a top of the base and covering a part of the envelope. The heat sink includes a circular base, a cylindrical transferring portion extending downwards from a bottom surface of the base, and a plurality of radial partition fins. The fins extend evenly and outwards from an outer surface of the transferring portion and simultaneously extending downwards from the bottom surface of the base. Engaging poles extend downwardly from the base of the heat sink for securing the LED wall lamp to a wall.

14 Claims, 4 Drawing Sheets

LED LAMP

BACKGROUND OF THE INVENTION

1. Field of the Invention

The present invention relates to an LED lamp, and particularly to an LED wall lamp having a heat dissipation apparatus for heat dissipation.

2. Description of Related Art

Generally, wall lamps or analogues such as night lamps are arranged on walls of passages, walkways or rooms and controlled by a switch or a sensor so as to light the lamps at night or in the dark. However, conventional wall lamps include a small heat-generated bulb as a light source. The small light bulb consumes a lot of power and also has safety problems after being used for a period of time with increased temperature. It is desired to replace the conventional wall lamp using a bulb with an LED wall lamp. However, an LED wall lamp has the problem of heat dissipation. When the heat is not properly dissipated, the LED wall lamp may flicker, which affects the light quality of the LED wall lamp.

What is needed, therefore, is an LED wall lamp which has greater heat-transfer and heat dissipation capabilities, whereby the LED wall lamp can operate normally for a sufficiently long period of time.

SUMMARY OF THE INVENTION

An LED wall lamp includes a heat sink having a base, an LED module attached to a top surface of the base of the heat sink, an envelope attached to the top surface of the base and receiving the LED module therein, and a cover coupled to a top of the base and covering the envelope. The heat sink includes a circular base, a cylindrical transferring portion extending downwards from a bottom surface of the base, and a plurality of radial partition fins. The fins extend evenly and outwards from an outer surface of the transferring portion and simultaneously extending downwards from the bottom surface of the base. Engaging poles are formed by the heat sink and located in the fins. The engaging poles are used for mounting the LED wall lamp to a wall. The cover includes a lampshade covering a part of the envelope and defining an opening for transmission of light emitted from the LED module therethrough to an outside of the LED lamp.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
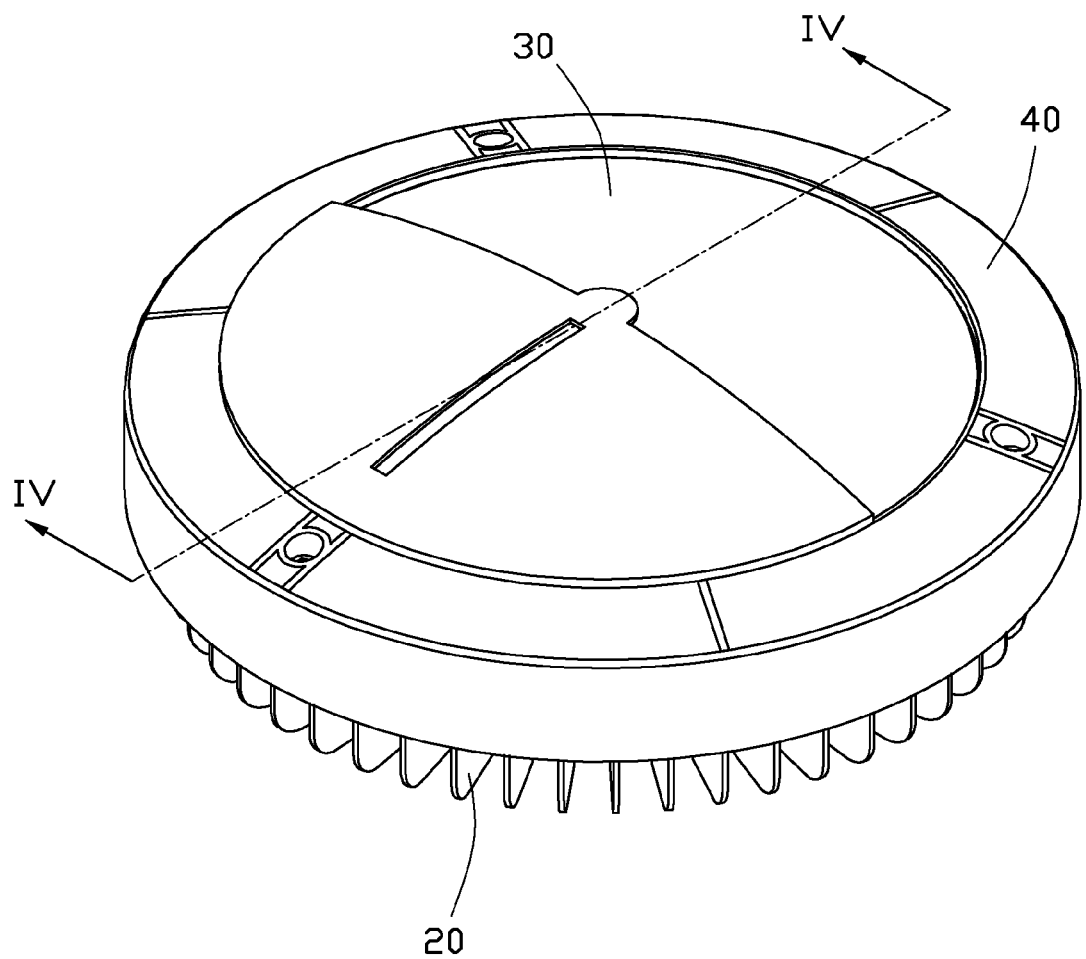
FIG. 1 is an assembled, isometric view of an LED wall lamp in accordance with a preferred embodiment of the present invention.
Figure 2:
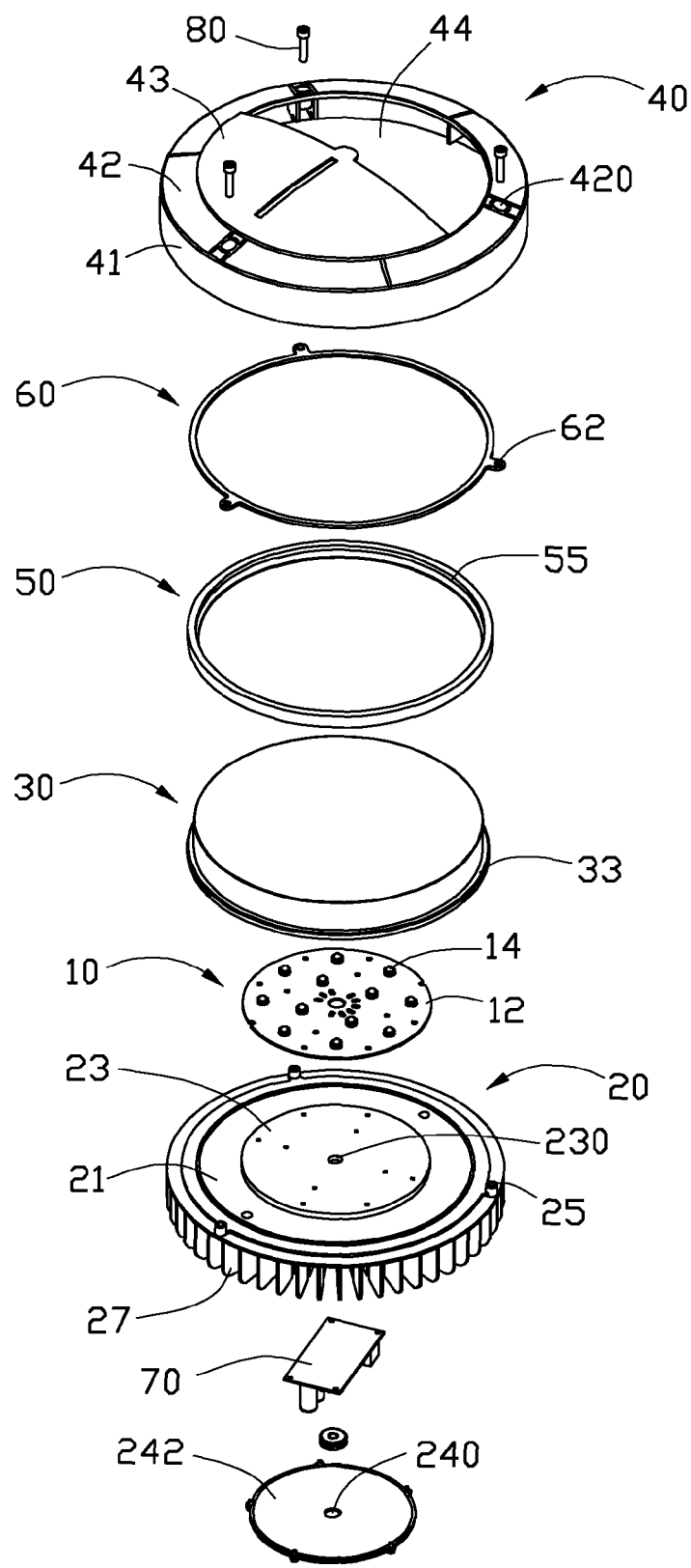
FIG. 2 is an exploded view of FIG. 1.

Referring to FIGS. 1-2, an LED wall lamp of a preferred embodiment of the invention comprises a heat sink 20, an LED module 10 mounted on a top of the heat sink 20, an envelope 30 attached on the heat sink 20 and receiving the LED module 10 therein, and a cover 40 mounted on the heat sink 20 and covering a part of the envelope 30. The LED wall lamp further comprises a driving circuit module 70 received in a bottom of the heat sink 20.

Figure 3:
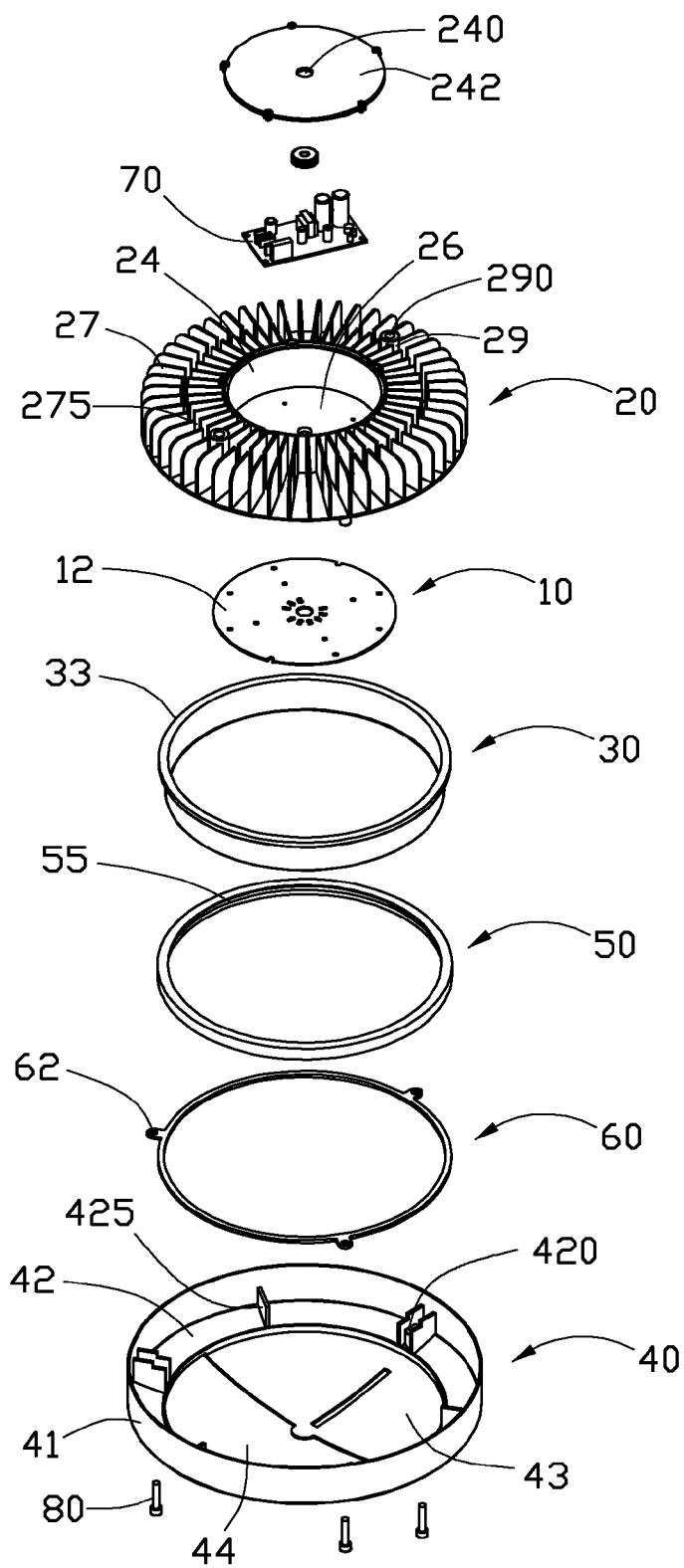
FIG. 3 is an inverted view of the LED wall lamp in FIG. 2.

Referring also to FIG. 3, the heat sink 20 is integrally formed of a metal with a good heat conductivity such as aluminum, copper or alloy thereof. The heat sink 20 comprises a circular base 21 and a plurality of fins 27 extending perpendicularly and downwardly from a bottom surface of the base 21. Three mounting posts 25 extend evenly and upwardly from an outer edge of the base 21. An absorbing portion 23 extends upwardly from a center of a top surface of the base 21 for attaching the LED module 10 thereon. A cylindrical transferring portion 24 extends downwards from the bottom of the base 21. The base 21, the absorbing portion 23 and the transferring portion 24 have a common axis. The transferring portion 24 defines a cylindrical cavity 26 for receiving the driving circuit module 70 therein. A central hole 230 extends through the absorbing portion 23 and the base 21 for communicating the cavity 26 of the transferring portion 24 with a top of the heat sink 20. The fins 27 extend evenly, outwards and radially from an outer surface of the transferring portion 24 and simultaneously extend downwards from the bottom surface of the base 21. The fins 27 each define a cut in a middle portion thereof. The cuts cooperatively form an annular channel 275 around the transferring portion 24 for facilitating airflow taking heat away from the fins 27 into ambient air. Two engaging poles 29 extend downwards from the base 21 and each define a hole 290 therein for receiving a locking member (not shown) to fix the LED wall lamp to a wall (not shown).

The LED module 10 comprises a circular printed circuit board 12 and a plurality of LEDs 14 mounted on the printed circuit board 12. The driving circuit module 70 is received in the cavity 26 of the transferring portion 24. A back plate 242 engages a bottom of the transferring portion 24 to close the cavity 26. The back plate 242 defines a central hole 240 therein, for extension of lead wires (not shown) of the driving circuit module 70 therethrough to connect with a power source. The lead wires of the driving circuit module 70 extend upwardly through the central hole 230 to electrically connect with the LED module 10.

The envelope 30 is bowl-shaped and made of transparent or semitransparent material such as glass and colophony. The envelope 30 has a circular and annular flange 33 extending outwards from a bottom edge thereof. An outer diameter of the flange 33 is less than that of the base 21, and the mounting posts 25 stand near an outer periphery of the flange 33 after the envelope 30 is mounted on the base 21. The envelope 30 is used to transmit light emitted by the LED module 10 and prevent foreign articles from entering the lamp to contaminate the LED module 10.

The cover 40 comprises an annular mounting plate 42 and a sidewall 41 downwardly extending from an outer edge of the mounting plate 42. Three engaging portions 420 downwardly and evenly extend from bottom of the mounting plate 42, for respectively in alignment with the mounting posts 25 of the heat sink 20. A plurality of ribs 425 inwards connects the mounting plate 42 and the sidewall 41. A semicircular lampshade 43 extends inwardly from an inner side of the mounting plate 42. The lampshade 43 and the mounting plate 42 cooperatively define a semicircular opening 44 for permitting the light from the LEDs 14 to transmit therethrough.

Figure 4:
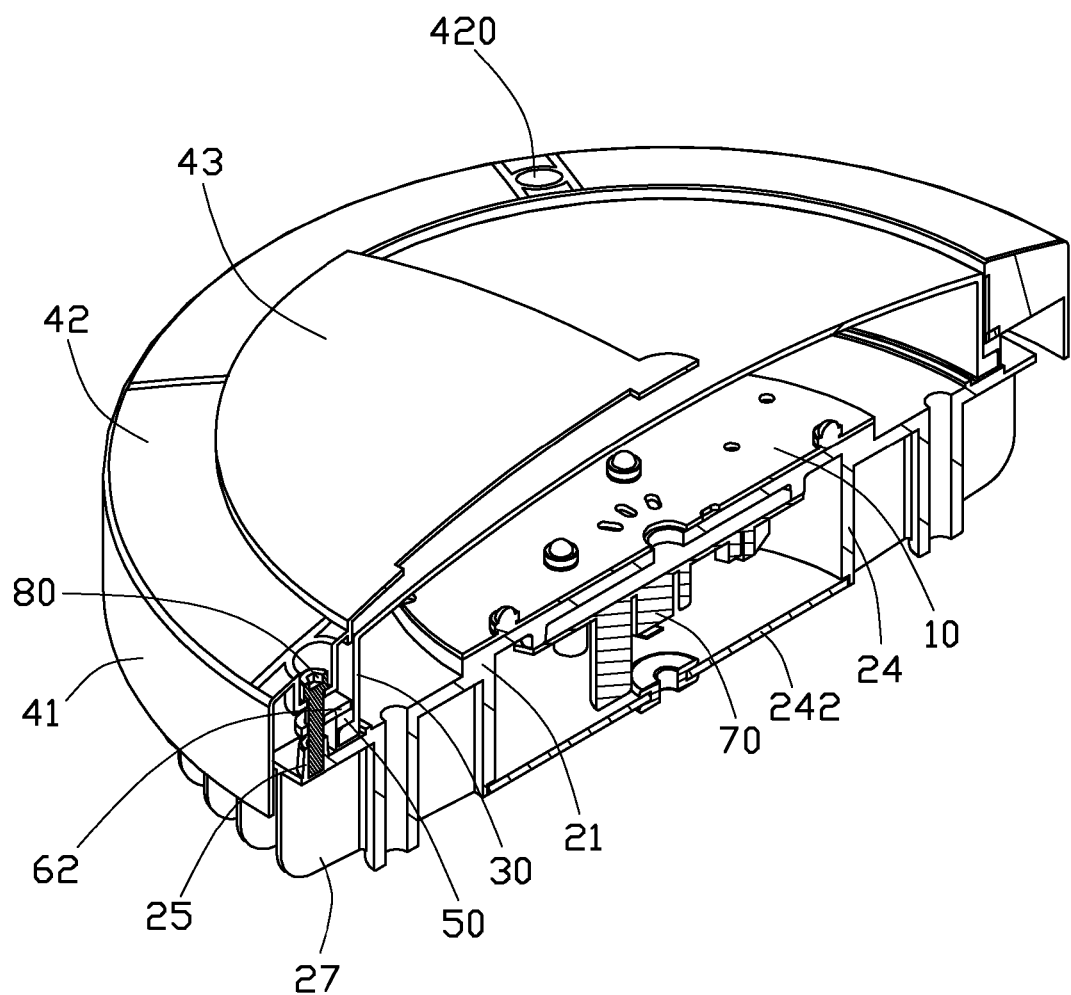
FIG. 4 is a cross-sectional view of the LED wall lamp of FIG. 1, taken along line IV-IV of FIG. 1.

Also referring to FIG. 4, in assembly of the LED wall lamp, the envelope 30 is attached to the top surface of the base 21 of the heat sink 20 and receives the LED module 10 therein. In order to prevent rainwater from creeping into the LED wall lamp when the LED wall lamp is used outdoors, a waterproof cushion 50 is used. The waterproof cushion 50 has a ring-shaped configuration and defines a groove 55 in an inner wall thereof for receiving the flange 33 of the envelope 30. A mounting ring 60 is mounted on the waterproof cushion 50 and defines three through orifices 62 therein. The cover 40 is fixed on the heat sink 20 by three screws 80 extending through the engaging portions 420 of the cover 40 and the through orifices 62 of the mounting ring 60 to screw into the mounting posts 25 of the heat sink 20. Thus, the envelope 30 engaging with the waterproof cushion 50 is tightly sandwiched between the heat sink 20 and the cover 40. In this embodiment, the sidewall 41 of the cover 40 downwardly extends beyond the base 21 and surrounds upper portions of the fins 27.

In use of the LED wall lamp, light generated by the LED module 10 transmits in a selective direction towards the outside since the lampshade 43 of the cover 40 covers a part of the envelope 30. The direction of the light can be adjusted via adjusting orientation of the cover 40 and accordingly orientations of the lamp shade 43 and semicircular opening 44. Therefore, versatility of the LED wall lamp according to the present invention can be promoted. Heat generated by the LED module 10 is absorbed by the absorbing portion 23 of the heat sink 20 and then delivered to the fins 27 to be dissipated into ambient air. The LED module 10 is thus cooled and works within an allowable temperature range. Furthermore, as the sidewall 41 of the cover 40 downwardly extends beyond the base 21 and surrounds upper portions of the fins 27, the fins 27 are not totally exposed outwards, whereby the LED wall lamp in accordance with the present invention can have a more aesthetic appearance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp, comprising:
    a heat sink comprising a circular base, a cylindrical transferring portion extending downwards from a bottom surface of the base, and a plurality of radial partition fins extending evenly and outwards from an outer surface of the transferring portion and simultaneously extending downwards from the bottom surface of the base, engaging poles extending downwardly from the base, adapted for mounting the LED lamp to a wall;
    a driving circuit module received in the transferring portion;
    an LED module attached to a top surface of the base of the heat sink;
    an envelope attached to the top surface of the base and receiving the LED module therein; and
    a cover coupled to a top of the base and comprising a lampshade, the lampshade covering a part of the envelope;
    wherein the cover comprises a mounting plate mounting the envelope on the top of the base and a sidewall extending downwardly from an outer edge of the mounting plate, the lampshade extending from an inner edge of the mounting plate.

2. The LED lamp as claimed in claim 1, wherein the lampshade has a semicircular configuration.

3. The LED lamp as claimed in claim 1, wherein the sidewall of the cover extends beyond the base of the heat sink and surrounds upper portions of the fins.

4. The LED lamp as claimed in claim 1, wherein the envelope has a flange extending from bottom thereof and being sandwiched between the mounting plate of the cover and the base of the heat sink.

5. The LED lamp as claimed in claim 4, wherein the flange of the envelope is received in a waterproof cushion, a mounting ring mounting the flange with the waterproof cushion on the base of the heat sink.

6. The LED lamp as claimed in claim 1, wherein the transferring portion of the heat sink defines a cavity for receiving the driving circuit module, a back plate engaging a bottom of the transferring portion to close the cavity.

7. The LED lamp as claimed in claim 1, wherein the fins each define a cut in middle portion thereof, the cuts cooperatively defining an annular channel surrounding the transferring portion.

8. An LED lamp, comprising:
    a heat sink comprising a base and a plurality of fins extending downwards from a bottom surface of the base;
    an LED module attached to a top surface of the base of the heat sink;
    an envelope attached to the top surface of the base and receiving the LED module therein; and
    a cover comprising a mounting plate securing the envelope on the base, a sidewall extending from an edge of the mounting plate and beyond the base of the heat sink and surrounding upper portions of the fins, and a lampshade at top thereof, the lampshade and the mounting plate correspondingly defining an opening for transmission of light generated by the LED module therethrough;
    wherein the envelope has a flange extending from a bottom thereof and being sandwiched between the mounting plate of the cover and the heat sink.

9. The LED lamp as claimed in claim 8, wherein the lampshade and the opening each have a semicircular configuration.

10. The LED lamp as claimed in claim 8, wherein the flange of the envelope is received in a waterproof cushion, a mounting ring mounting the flange with the waterproof cushion on the base of the heat sink.

11. The LED lamp as claimed in claim 8, wherein the heat sink has a cylindrical transferring portion extending downwards from the bottom of the base, the fins extending evenly and outwards from an outer surface of the transferring portion and simultaneously extending downwards from the bottom surface of the base.

12. An LED lamp, comprising:
    a heat sink comprising a circular base, a cylindrical transferring portion extending downwards from a bottom surface of the base, and a plurality of radial partition fins extending evenly and outwards from an outer surface of the transferring portion and simultaneously extending downwards from the bottom surface of the base, engaging poles extending downwardly from the base, adapted for mounting the LED lamp to a wall;
    a driving circuit module received in the transferring portion;
    an LED module attached to a top surface of the base of the heat sink;
    an envelope attached to the top surface of the base and receiving the LED module therein; and
    a cover coupled to a top of the base and comprising a lampshade, the lampshade covering a part of the envelope;

wherein the transferring portion of the heat sink defines a cavity for receiving the driving circuit module, a back plate engaging a bottom of the transferring portion to close the cavity.

13. The LED lamp as claimed in claim 12, wherein the lampshade has a semicircular configuration.

14. The LED lamp as claimed in claim 12, wherein the fins each define a cut in middle portion thereof, the cuts cooperatively defining an annular channel surrounding the transferring portion.

* * * * *